(12) United States Patent
Setsompop et al.

(10) Patent No.: US 12,270,884 B2
(45) Date of Patent: Apr. 8, 2025

(54) LIPID SUPPRESSION IN MAGNETIC RESONANCE IMAGING USING MULTI-COIL LOCAL $B_0$ FIELD CONTROL

(71) Applicant: The General Hospital Corporation, Boston, MA (US)

(72) Inventors: Kawin Setsompop, Stanford, CA (US); Jinmin Xu, Hangzhou (CN); Jason Stockmann, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 164 days.

(21) Appl. No.: 18/312,972

(22) Filed: May 5, 2023

(65) Prior Publication Data

US 2023/0358836 A1    Nov. 9, 2023

Related U.S. Application Data

(60) Provisional application No. 63/338,700, filed on May 5, 2022.

(51) Int. Cl.
*G01V 3/00* (2006.01)
*G01R 33/385* (2006.01)
(Continued)

(52) U.S. Cl.
CPC ....... *G01R 33/5608* (2013.01); *G01R 33/385* (2013.01); *G01R 33/3875* (2013.01); *G01R 33/4818* (2013.01)

(58) Field of Classification Search
CPC .............. G01R 33/5608; G01R 33/385; G01R 33/3875; G01R 33/4818
(Continued)

(56) References Cited

U.S. PATENT DOCUMENTS 10,261,145 B2    4/2019    Wald et al.

FOREIGN PATENT DOCUMENTS

JP    2017000573 A    *   1/2017

OTHER PUBLICATIONS

Arango N, Stockmann JP, Witzel T, Wald L, White J. Open-source, low-cost, flexible, current feedback-controlled driver circuit for local B 0 shim coils and other applications. Int. Soc. Magn. Res. Med. 2016, p. 1157.
(Continued)

*Primary Examiner* — Walter L Lindsay, Jr.
*Assistant Examiner* — Frederick Wenderoth
(74) *Attorney, Agent, or Firm* — QUARLES & BRADY LLP

(57) ABSTRACT

Lipid suppression in magnetic resonance imaging ("MRI") is provided on a slice-by-slice basis using tailored local field control that is configured for lipid control for each slice in a planned slice prescription. Only those lipid voxels that fall within the bandwidth of the concurrent RF excitation pulse are targeted. Switched $B_0$ offset fields are used to improve lipid suppression pulse performance by pushing water and lipids apart in the frequency domain. Multi-coil $B_0$ shim arrays with rapidly switchable output currents that can be turned on during the lipid suppression pulse may be used. A convex optimization may be used to jointly solve for the shim currents and the lipid suppression pulse center frequency and bandwidth to optimize lipid suppression while minimizing water signal loss.

20 Claims, 10 Drawing Sheets

(51) Int. Cl.
*G01R 33/3875* (2006.01)
*G01R 33/48* (2006.01)
*G01R 33/56* (2006.01)

(58) Field of Classification Search
USPC .......................................................... 324/309
See application file for complete search history.

(56) References Cited

OTHER PUBLICATIONS

Arango N., J.P. Stockman, B. Strasser, B. Gagoski, O. Andronesi, L.L. Wald, J. White, E. Adalsteinsson. Dynamically switched B0 field control for separate optimization of tailored volume lipid suppression and B0 homogeneity for brain chemical shift imaging at 3T using multi-coil shim array. Proc. Intl. Soc. Mag. Reson. Med, vol. 26 (2018), p. #1062.
Arango, Nicolas. Sequence-phase optimal (SPO)$\Delta B_0$ field control for lipid suppression and homogeneity for brain magnetic resonance spectroscopic imaging. Diss. Massachusetts Institute of Technology, 2020.
Balchandani P, Spielman D. Fat suppression for 1H MRSI at 7T using spectrally selective adiabatic inversion recovery. Magnetic resonance in medicine. May 1, 2008;59(5): 980-8.
Boer VO, van de Lindt T, Luijten PR, Klomp DW. Lipid suppression for brain MRI and MRSI by means of a dedicated crusher coil. Magnetic resonance in medicine. Jun. 1, 2015;73(6):2062-8.
Del Grande, Filippo, et al. "Fat-suppression techniques for 3-T MR imaging of the musculoskeletal system." Radiographics 34.1 (2014): 217-233.
Esmaeili M, Bathen TF, Rosen BR, Andronesi OC. Three-dimensional MR spectroscopic imaging using adiabatic spin echo and hypergeometric dual-band suppression for metabolic mapping over the entire brain. Magnetic resonance in medicine. Feb. 1, 2017;77(2):490-7.
Glover, Gary H., and Erika Schneider. "Three-point Dixon technique for true water/fat decomposition with B0 inhomogeneity correction." Magnetic resonance in medicine 18.2 (1991): 371-383.
Hernando, D., et al. "Removal of olefinic fat chemical shift artifact in diffusion MRI." Magnetic Resonance in Medicine 65.3 (2011): 692-701.
Huang, Susie Y., et al. "Body MR imaging: artifacts, k-Space, and solutions." Radiographics 35.5 (2015): 1439-1460.
Juchem C, Rudrapatna SU, Nixon TW, de Graaf RA. Dynamic multi-coil technique (DYNAMITE) shimming for echo-planar imaging of the human brain at 7 Tesla. Neuroimage. Jan. 15, 2015;105:462-72.
Kizildag E, Stockmann p. Gagoski B, Guerin B, Grant E, Wald L, Elfar A. Improved spiral chemical shift imaging at 3 Tesla using a 32-channel integrated RF-shim coil array. Int. Soc. Magn. Res. Med. 2016, p. 0380.
Liao, Congyu, et al. "High-fidelity, high-isotropic-resolution diffusion imaging through gSlider acquisition with and T1 corrections and integrated $\Delta B0$/Rx shim array." Magnetic Resonance in Medicine 83.1 (2020): 56-67.
Luo Y, De Graaf RA, DelaBarre L, Tannus A, Garwood M. Bistro: an outer-volume suppression method that tolerates RF field inhomogeneity. Magnetic resonance in medicine. Jun. 1, 2001;45(6): 1095-102.
Ozhinsky E, Vigneron DB, Nelson SJ. Improved spatial coverage for brain 3D PRESS MRSI by automatic placement of outer-volume suppression saturation bands. Journal of Magnetic Resonance Imaging. Apr. 1, 2011;33(4):792-802.
Pauly, John, et al. "Parameter relations for the Shinnar-Le Roux selective excitation pulse design algorithm (NMR imaging)." IEEE transactions on medical imaging 10.1 (1991): 53-65.
Scheenen TW, Klomp DW, Wijnen JP, Heerschap A. Short echo time 1H-MRSI of the human brain at 3T with minimal chemical shift displacement errors using adiabatic refocusing pulses. Magnetic resonance in medicine. Jan. 1, 2008;59 (1): 1-6.
Star-Lack J, Nelson SJ, Kurhanewicz J, Huang L, Vigneron DB. Improved water and lipid suppression for 3D PRESS CSI using RF band selective inversion with gradient dephasing (BASING). Magnetic resonance in medicine. Aug. 1, 1997;38(2):311-21.
Stockmann JP, Witzel T, Keil B, Polimeni JR, Mareyam A, LaPierre C, Setsompop K, Wald LL. A 32-channel combined RF and B0 shim array for 3T brain imaging. Magn. Reson. Med. 2016;75(1): 441-51.

* cited by examiner

LIPID SUPPRESSION IN MAGNETIC RESONANCE IMAGING USING MULTI-COIL LOCAL $B_0$ FIELD CONTROL

CROSS-REFERENCE TO RELATED APPLICATIONS

This application claims the benefit of U.S. Provisional Patent Application Ser. No. 63/338,700, filed on May 5, 2022, and entitled "Improved Lipid Suppression in MRI Using Multi-Coil Local $B_0$ Field Control," which is herein incorporated by reference in its entirety.

STATEMENT OF FEDERALLY SPONSORED RESEARCH

This invention was made with government support under EB028797 awarded by the National Institutes of Health. The government has certain rights in the invention.

BACKGROUND

Incomplete lipid suppression results in chemical shift artifacts in a variety of brain and body pulse sequences for imaging and spectroscopy. The mostly used lipid suppression method is chemically selective saturation. In this method, a short-duration, frequency-selective RF excitation pulse is first applied to rotate the lipid magnetization into the transverse plane. Immediately thereafter, the lipid magnetization is dephased by application of a strong spoiler gradient along one or more axes. This process theoretically leaves only the magnetization of water aligned with the z-axis and available to participate in the ensuing pulse sequence. However, in the real application, $B_0$ inhomogeneity arising from tissue susceptibility interfaces causes spectral line broadening and spectral overlapping between lipid and water. As a result, chemical shift artifacts sometimes appear in the image, including residual fat signal and fat voxels that get shifted within the field of view (often overlapping with the brain in head imaging).

SUMMARY OF THE DISCLOSURE

It is an aspect of the present disclosure to provide a method for lipid suppression in magnetic resonance imaging ("MRI"). The method includes acquiring k-space data with the MRI system using a pulse sequence that includes a lipid suppression block for suppressing lipid signals and an imaging block for acquiring the k-space data. The lipid suppression block includes, for each slice in a planned slice prescription, applying a lipid suppression radio frequency ("RF") pulse having a center frequency and a bandwidth tailored for the slice and generating a $B_0$ offset field with a shim coil array while applying the lipid suppression RF pulse, where the $B_0$ offset field is also tailored for the slice. A plurality of images are reconstructed from the k-space data using a computer system. The plurality of images includes an image for each slice in the planned slice prescription, in which lipid signals are substantially suppressed.

It is another aspect of the present disclosure to provide a method for lipid suppression in MRI, which includes accessing $B_0$ field map data with a computer system, and generating local mask data for each slice in a planned slice prescription using the computer system. The local mask data include a lipid mask for each slice in the planned slice prescription. The $B_0$ field map data and local mask data are input to a joint optimization algorithm using the computer system, generating shim current settings and lipid suppression pulse parameters as an output. A pulse sequence is designed using the computer system, where the pulse sequence includes a lipid suppression block designed based on the shim current settings and lipid suppression pulse parameters. The method then includes acquiring k-space data from slices in a subject according to the planned slice prescription using an MRI system performing the pulse sequence. The lipid suppression block of the pulse sequence includes, for each slice in the planned slice prescription: applying a spectrally selective RF pulse using the lipid suppression pulse parameters for the respective slice and generating a $B_0$ offset field by supplying the shim current settings for the respective slice to a shim coil array. A plurality of images is reconstructed from the k-space data, where the plurality of images depict the slices in the subject with reduced lipid signals.

It is yet another aspect of the present disclosure to provide an MRI system that includes a magnet system to generating a main magnetic field, $B_0$; an RF system including at least one RF coil; a gradient system including at least one gradient coil; a shim system including a shim coil array; and a processor. The processor receives slice-specific lipid suppression RF pulse parameters and slice-specific shim current settings. For a given slice in a planned slice prescription, the processor simultaneously controls: the at least one RF coil of the RF system to generate a spectrally selective RF pulse according to the slice-specific lipid suppression RF pulse parameters for the given slice, and the shim coil array of the shim system to generate a $B_0$ offset field according to the slice-specific shim current settings for the given slice.

DETAILED DESCRIPTION

Described here are systems and methods for lipid suppression in magnetic resonance imaging ("MRI") using a tailored local field control that is configured for lipid control on a slice-specific basis. Using the disclosed systems and methods, only those lipid voxels that fall within the bandwidth of the concurrent RF excitation pulse are targeted. Switched $B_0$ offset fields are used to improve lipid suppression pulse performance in 2D MRI by pushing water and lipids apart in the frequency domain. The method may be realized using multi-coil $B_0$ shim arrays with rapidly switchable output currents that can be turned on during the lipid suppression pulse. A convex optimization is used to jointly solve for the shim currents and the lipid suppression pulse center frequency to optimize lipid suppression while minimizing water signal loss.

Figure 1A:
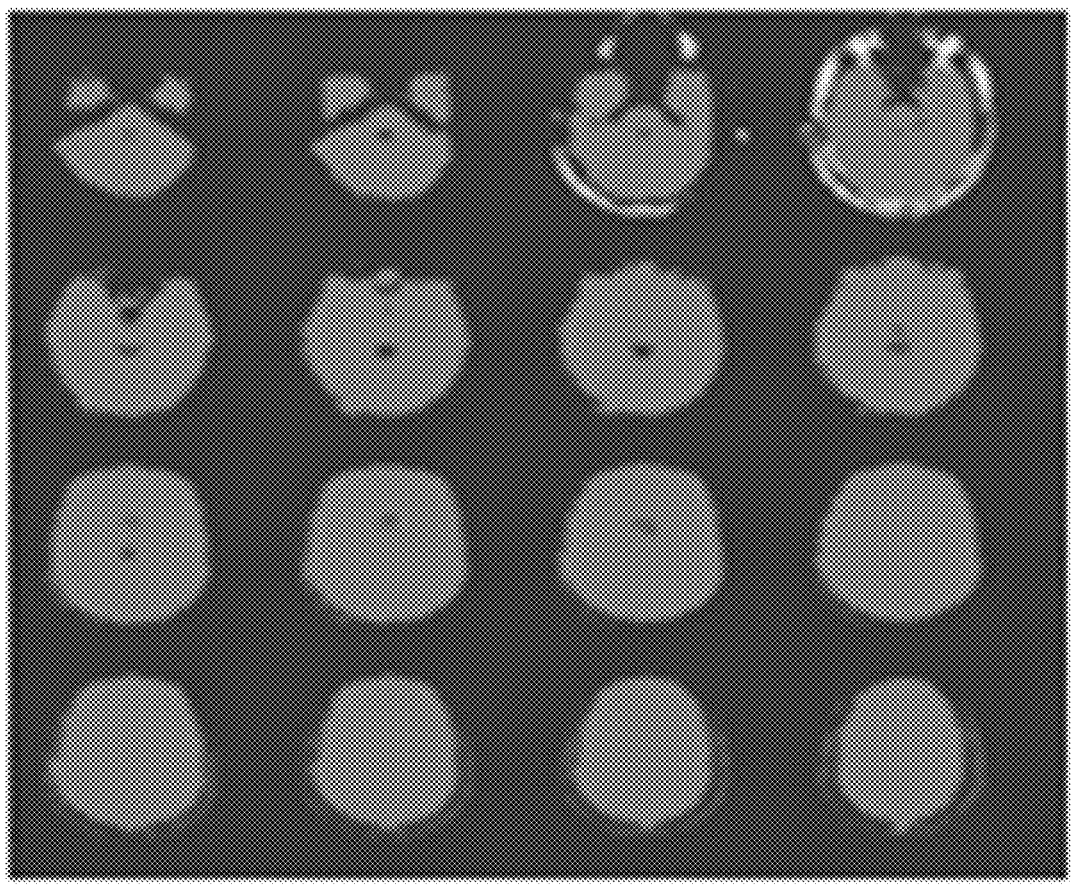
FIG. 1A illustrates example local masks for masking lipid and/or water on a slice-by-slice basis.
Figure 1B:
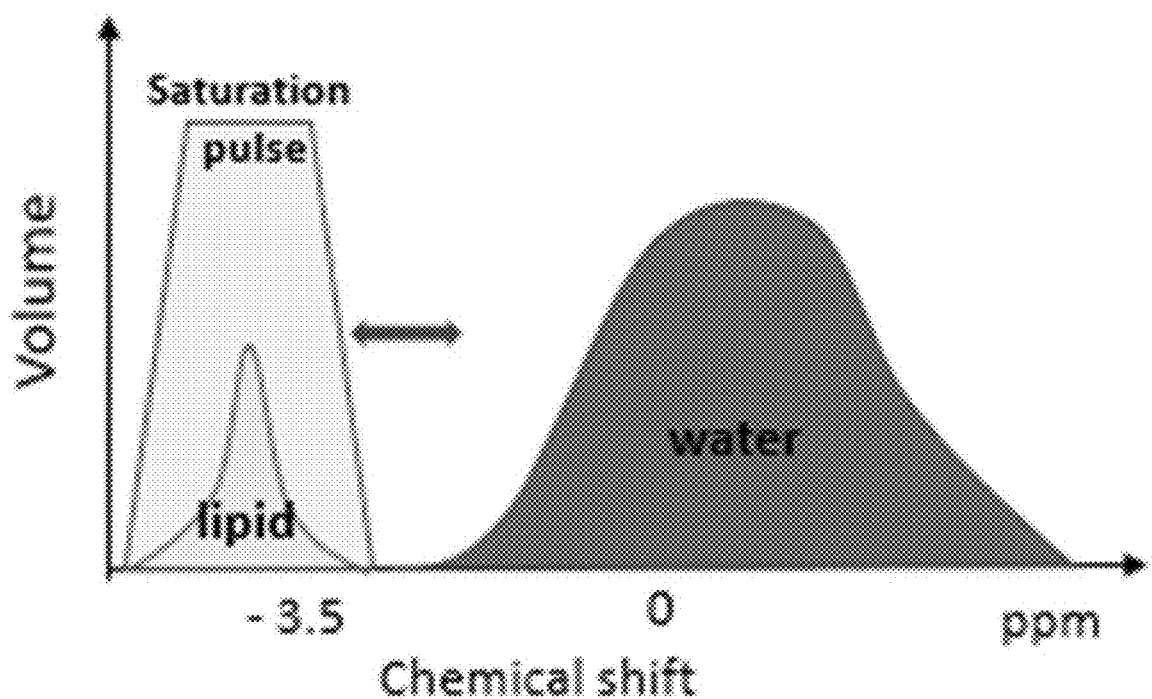
FIG. 1B shows an off-resonance histogram of lipid an water. Using the techniques described in the present disclosure, the lipid and water signals can be separated, after which a saturation pulse can suppress almost all of the lipid signal without saturating the water.
Figure 1C:
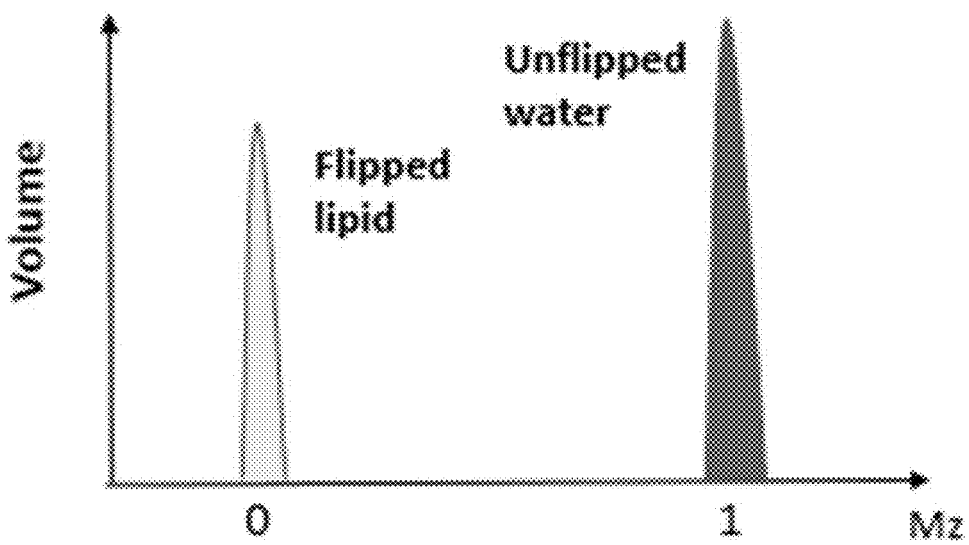
FIG. 1C shows a z-magnetization histogram of lipid and water. Using the techniques described in the present disclosure, almost all of the lipid signal is suppressed without losing water signal.

Multi-coil $B_0$ shim arrays can be used to improve lipid suppression in magnetic resonance spectroscopic imaging by rapidly switching on a tailored field offset during the lipid suppression pulse. This approach can be extended to MRI by adapting an optimization problem to account for the lipid voxels that only fall within the bandwidth of the water excitation pulse for the slice being acquired, as illustrated in FIG. 1A. By pushing the lipid and water signals apart with extra $B_0$ offset fields and applying a saturation pulse with shifted frequency and proper bandwidth, almost all of the lipid signal can be suppressed without losing water signal, as shown in the off-resonance histogram of FIG. 1B and z-magnetization histogram of FIG. 1C. This approach relaxes the demands on the $B_0$ shim hardware by reducing the lipid region-of-interest ("ROI") for each shim optimization instance, rather than trying to include all lipid voxels over the whole head or other anatomical target.

Figure 2:
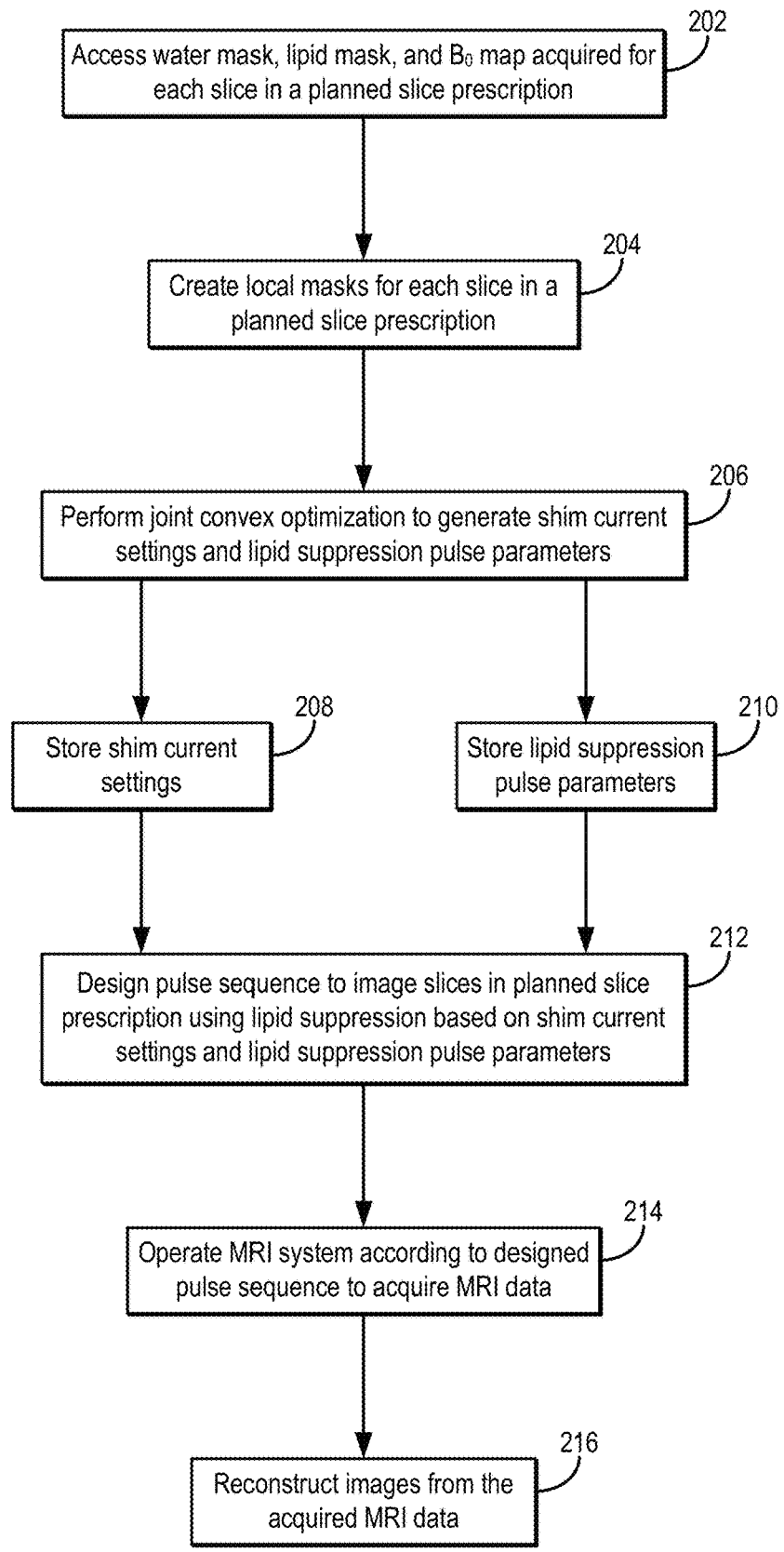
FIG. 2 is a flowchart setting forth the steps of an example method for lipid suppression in magnetic resonance imaging ("MRI") using multi-coil local $B_0$ field control.

Referring now to FIG. 2, a flowchart is shown as setting forth the steps of an example method for improving lipid suppression while acquiring images of a subject using an MRI system.

The method includes accessing a water mask, lipid mask, and field map (e.g., $B_0$ field map) for each slice in a planned slice prescription, as indicated at step 202. Accessing the water mask, lipid mask, and field map for each slice may include retrieving previously generated masks and field maps from a memory or other machine-readable data storage device or medium. Additionally or alternatively, accessing the masks and field maps may include acquiring magnetic resonance imaging data with an MRI system and generating the masks and field maps from the imaging data. For example, a 3-point Dixon method may be implemented with an MRI system to acquire the water and lipid masks, as well as a baseline field map. As one non-limiting example, the 3-point Dixon method may be performed using a suitable pulse sequence with echo times TE=2.46 ms, 3.69 ms, 4.92 ms. Alternatively, other echo times may be used, as well as other techniques for acquiring water and lipid masks and field maps, such as other multi-point Dixon methods.

A local mask is generated for each planned slice location to be imaged, as indicated at step 204. The local mask selects only the lipid areas in each particular slice, rather than the entire imaging volume. Additionally, the local mask ensures that no water signals will be saturated over the entire imaging volume. By way of example, the local mask can be generated by simulating the slice-select process for each planned slice location to create the tailored local mask that only includes the lipid excited by the slice-select gradient and all the water over the whole volume. Accordingly, the local mask only focuses on the lipid that will appear in the image during the 2D MRI acquisition and will also make sure no water signals over the volume get saturated.

A joint convex optimization is then used to separate the lipid and water apart shown in the local mask for each slice, as indicated at step 206. The joint convex optimization receives as inputs: the tailored local masks generated in step 204, the field map accessed in step 202, and a transition band of the saturation pulse that will be used in the imaging pulse sequence. In some examples, the field map may serve as a basis set for a multi-coil shim array.

The joint convex optimization is preferably constrained using one or more constraints. For example, the constraints may include a current limitation for each shim coil in the shim coil array (whether a local shim coil array or a body shim coil array) as well as a total current limitation for the shim coil array. The current limitations may be 3.5 A per channel and 40 A in total. Additionally or alternatively, the constraints may include a bandwidth limitation of the ideal lipid spectral histogram.

The output of the joint convex optimization includes a current setting for each channel of the multi-coil shim array, which may be stored as indicated at step 208. These current settings correspond to the current for driving each coil in the shim coil array to generate an additional $B_0$ offset field that will be used to separate the lipid and water signals for each slice. Accordingly, current settings may be output for each slice in the planned slice prescription. Lipid suppression pulse parameters are also output by the joint convex optimization, which may be stored as indicated at step 210. The lipid suppression pulse parameters may include the frequency, bandwidth, and/or time duration (equivalent to the bandwidth with the same time-bandwidth-product) for the pulse.

The shim coil current settings and lipid suppression pulse parameters are then sent to the MRI system to design a pulse sequence, as indicated at step 212. For example, the shim coil current settings and lipid suppression pulse parameters may be sent to a pulse sequence server of the MRI system to facilitate design of the pulse sequence for imaging the subject with improved lipid suppression.

Figure 3:
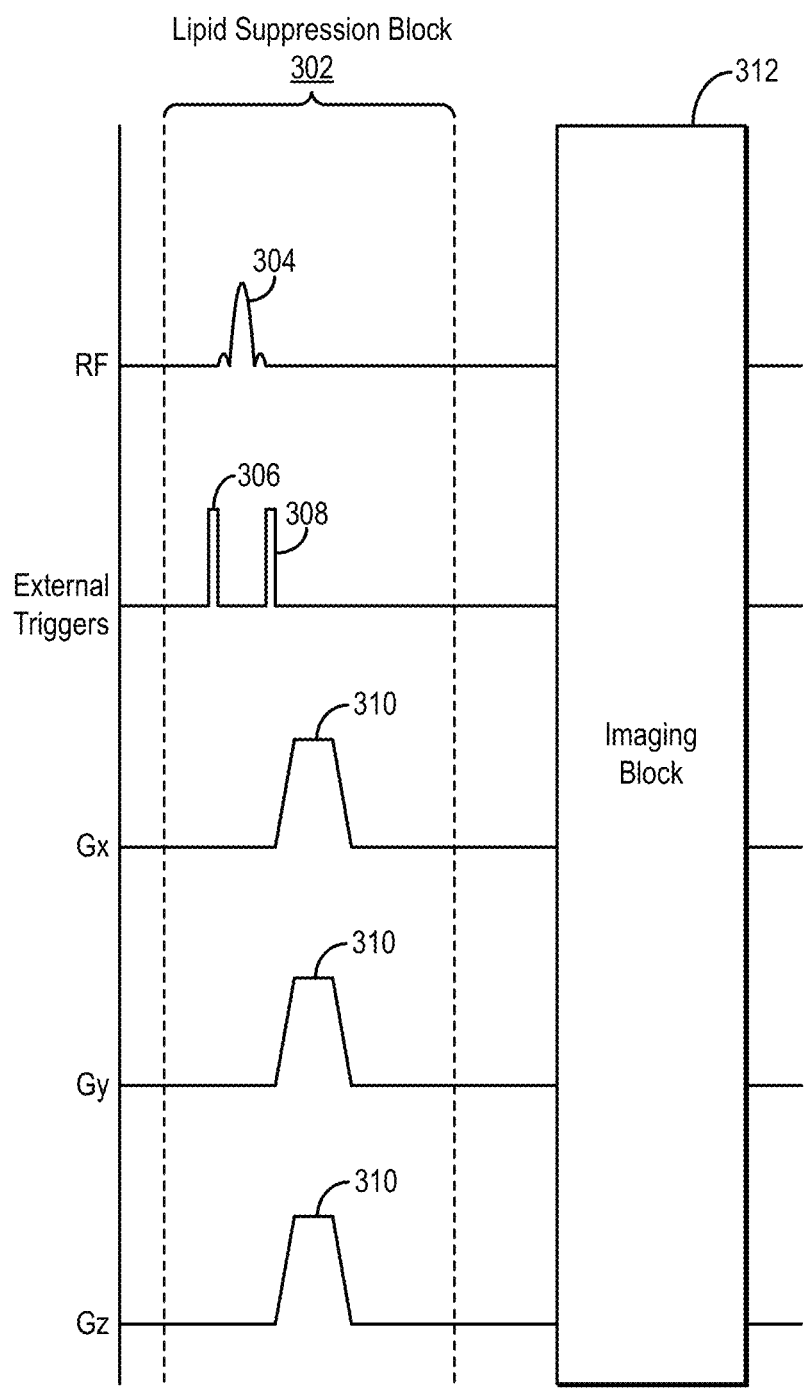
FIG. 3 is an example pulse sequence diagram that can implement the lipid suppression techniques described in the present disclosure.

An example pulse sequence that can implement the lipid suppression techniques described in the present disclosure is shown in FIG. 3. Advantageously, the pulse sequence includes lipid suppression RF pulses whose frequency and bandwidth are tailored for each slice. That is, the pulse sequence includes reloading a specific frequency and bandwidth for the lipid suppression RF pulse for each slice.

The example pulse sequence includes a lipid suppression block 302 followed by an imaging block 312. In the lipid suppression block 302, a lipid suppression RF pulse 304 is played out to tip magnetization of lipid signals from the longitudinal axis through a flip angle. The flip angle may be 90 degrees, such that the lipid magnetization is rotated into the transverse plane. Alternatively, the flip angle may be selected from the range of 110-150 degrees to offset the rapid magnetization recovery of lipid. For example, the flip angle may be selected as 110 degrees.

In general, the lipid suppression RF pulse 304 may be a spectrally selective RF pulse that is tailored to excite only lipid signals in the prescribed slice. As described above, the center frequency and bandwidth of the lipid suppressed RF pulse 304 is tailored for the slice to be excited in each repetition of the pulse sequence. That is, the center frequency and bandwidth of the lipid suppression RF pulse 304 may be changed from one slice excitation to the next.

A first external trigger 306 is applied prior to generating the lipid suppression RF pulse 304. The first external trigger 306 controls the shim coil array (e.g., a local shim coil array, a body shim coil array) to generate a $B_0$ offset field determined for the slice location by the joint convex optimization described above. The $B_0$ offset field moves the water and lipid signal resonance peaks away from each other, which together with the lipid suppression center frequency and bandwidth determined for the slice location provides an improved lipid suppression without reducing the measurable water signal through inadvertent suppression of water signals. After the lipid suppression RF pulse 304 is played out, a second external trigger 308 causes controls the shim coil array to turn off the $B_0$ offset field.

In the illustrated example, following excitation of the lipid signals by the lipid suppression RF pulse 304, one or more spoiler gradients 310 are applied to dephase, or saturate, the lipid magnetization. Following saturation of the lipid signals, the pulse sequence can proceed with exciting and acquiring data from water signals in the imaging block 312. For example, the imaging block may include any suitable combination of RF pulses and/or magnetic field gradients for generating transverse magnetization (e.g., from water signals) and acquiring k-space data in response thereto. For example, the imaging block 312 may implement an echo planar imaging ("EPI") acquisition, a spin echo acquisition, a gradient echo acquisition, or the like. The imaging block 312 may implement a Cartesian sampling of k-space, or a non-Cartesian sampling of k-space, such as a radial sampling, a spiral sampling, and so on.

In some examples, the pulse sequence may include a simultaneous multislice ("SMS") acquisition, in which case the lipid suppression RF pulse 304 may be a multiband RF pulse having center frequencies and bandwidths established by the center frequencies and bandwidths tailored for slices to be excited in the given repetition of the SMS acquisition. Similarly, the RF pulses used in the imaging block 312 may also be multiband RF pulses in these implementations.

Referring again to FIG. 2, the designed pulse sequence is then used to operate the MRI system to acquire lipid-suppressed magnetic resonance imaging data, as indicated at step 214. For example, the pulse sequence server may send the shim coil current settings to a shim controller of the MRI system to generate the $B_0$ field offsets used to separate lipid and water signals according to the design pulse sequence. Similarly, the pulse sequence server may send the lipid suppression pulse parameters to an RF system of the MRI system to generate lipid suppression RF pulses in accordance with the determined parameters for each slice based on the designed pulse sequence.

Images are then reconstructed from the acquired MRI data, as indicated at step 216. Using the techniques described above, the images have improved lipid suppression while reducing inadvertent suppression of water signals in each slice that is imaged.

Figure 4:
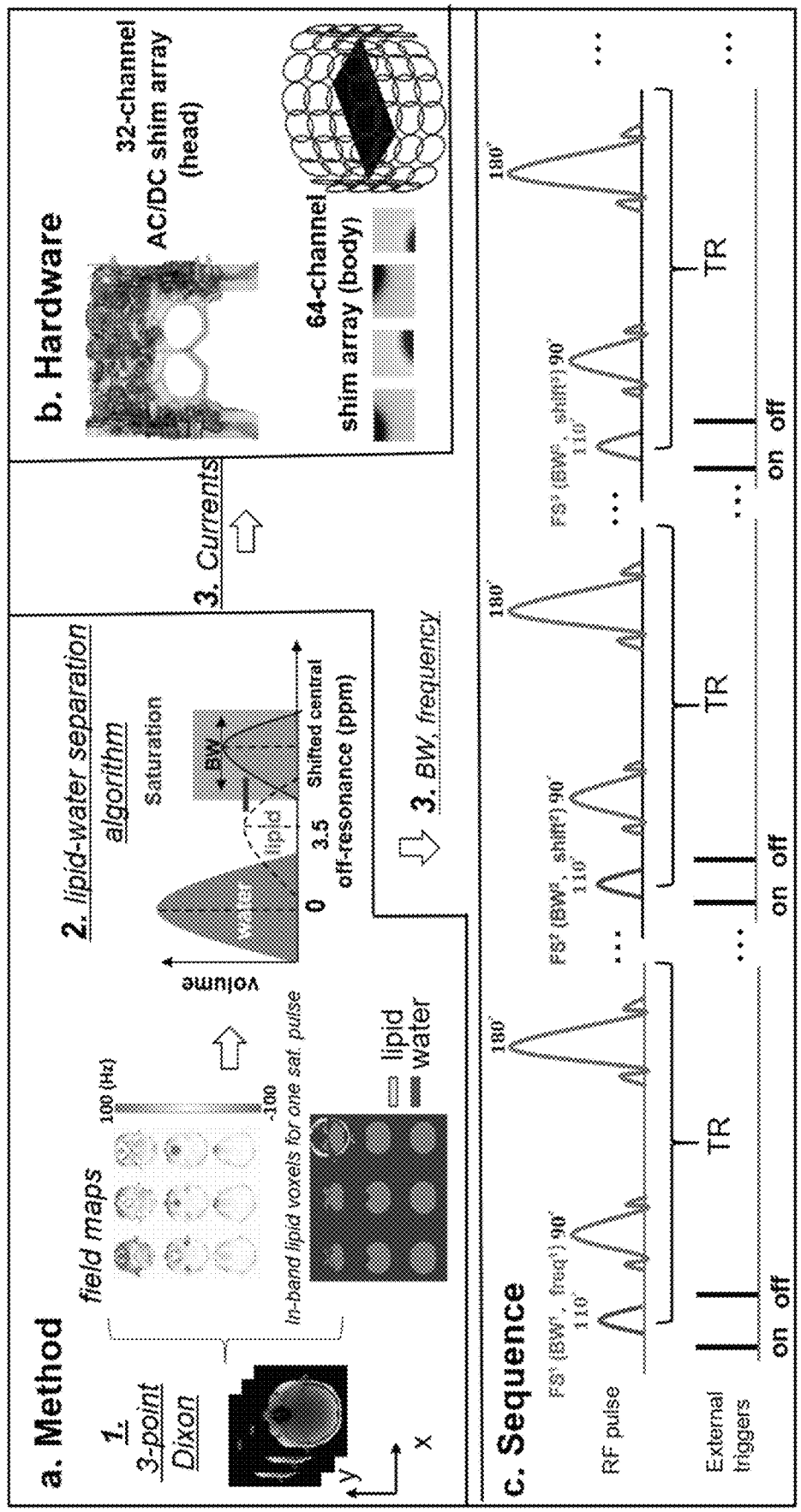
FIG. 4 illustrates an example workflow implementing the methods described in the present disclosure. In (a) a 3-point Dixon acquisition provides water and lipid masks and $B_0$ field map. For each acquired slice, a convex optimization tool chooses shim currents for a shim coil array (e.g., a 32-ch AC/DC array) and the center frequency and BW of the lipid saturation pulse. In (b), the shim coil array (e.g., a 32-ch AC/DC shim array (head), a 64-ch body shim array, etc.) receive the shim current settings. In (c), the lipid saturation pulse parameters are updated for each slice in the designed pulse sequence.

FIG. 4 illustrates a workflow implementing the methods described above. In this example workflow, a 3-point Dixon acquisition provides water and lipid masks and $B_0$ field map, as shown in inset (a). For each acquired slice, a convex optimization is performed to determine shim currents for a shim coil array and lipid suppression pulse parameters, including the center frequency and BW of the lipid saturation pulse. In inset (b), the shim coil array (e.g., a 32-ch AC/DC shim array (head), a 64-ch body shim array, etc.) receive the shim current settings. In inset (c), the lipid saturation pulse parameters are updated for each slice in the designed pulse sequence.

Figure 5:
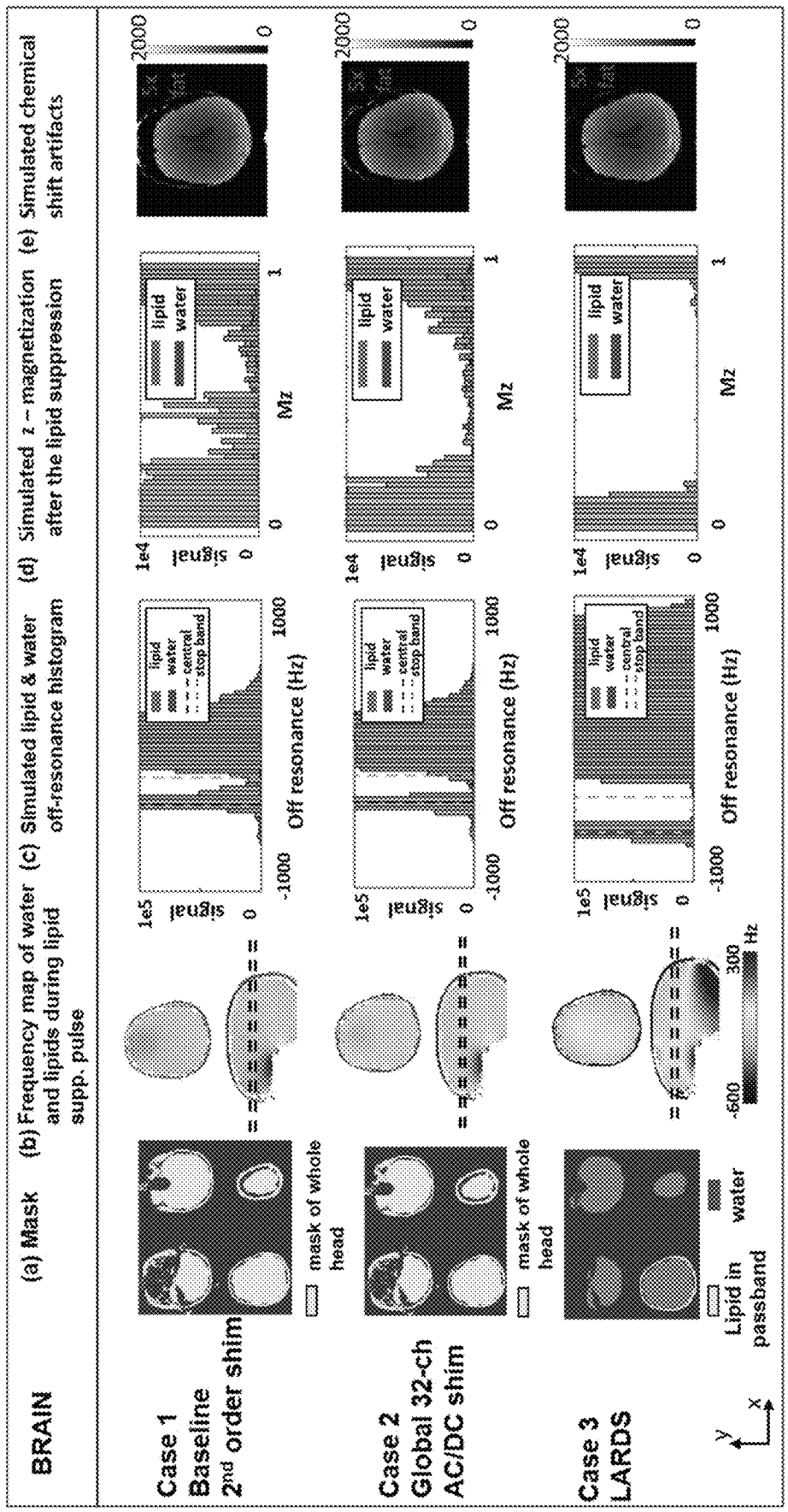
FIG. 5 illustrates a comparison of three lipid suppression scenarios in the brain. For each case, the off-resonance histogram (c) and z-magnetization (d) were simulated for water and lipids. (e) chemical shift artifacts in brain slices due to residual lipid are also simulated (5× fat for a better contrast).
Figure 6:
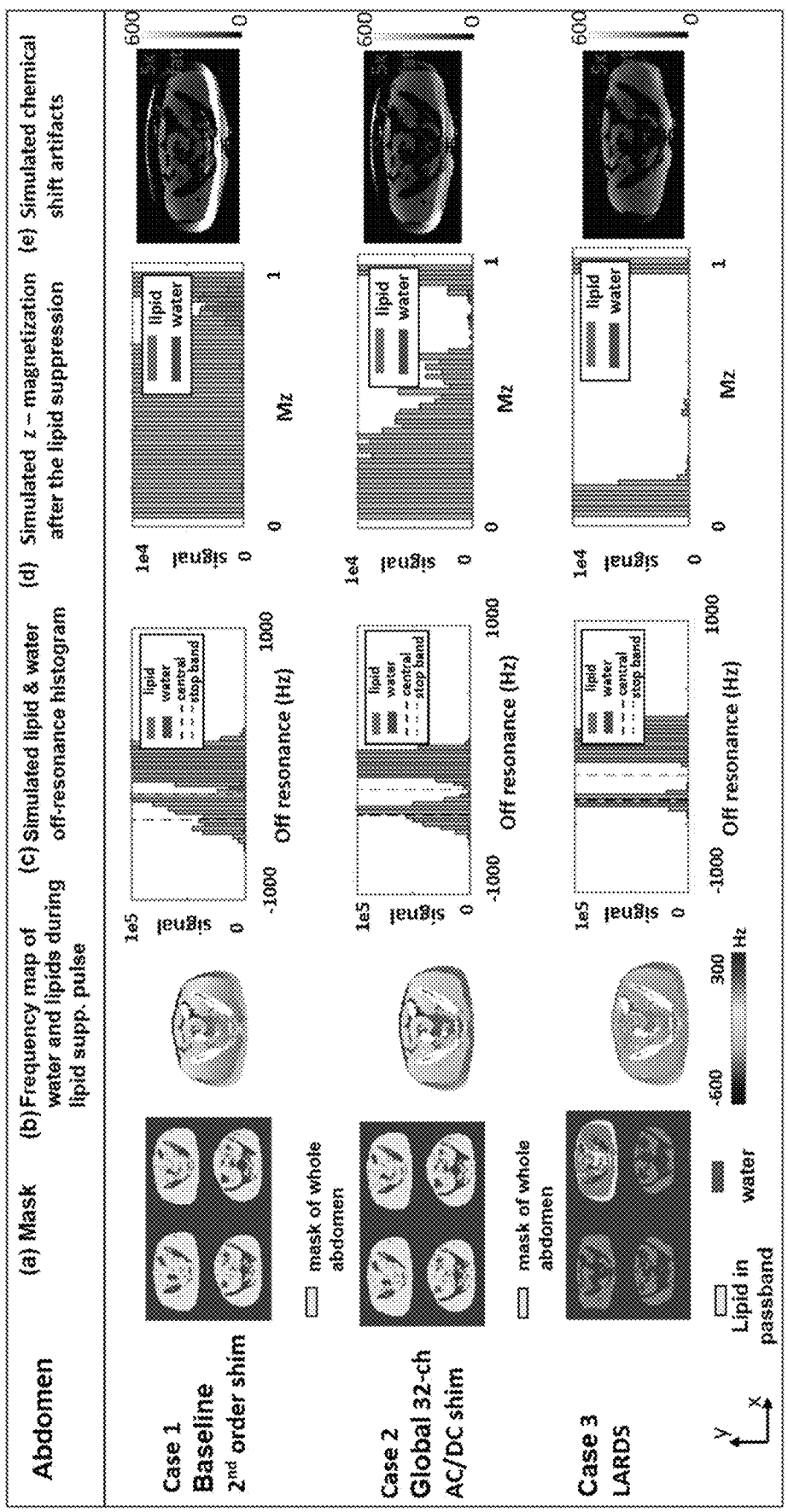
FIG. 6 illustrates a comparison of three lipid suppression scenarios in the abdomen. The simulated off-resonance histogram, z-magnetization and chemical shift artifacts (5× fat for a better contrast) clearly show the benefit of the techniques described in the present disclosure compared to conventional shimming.
Figure 7:
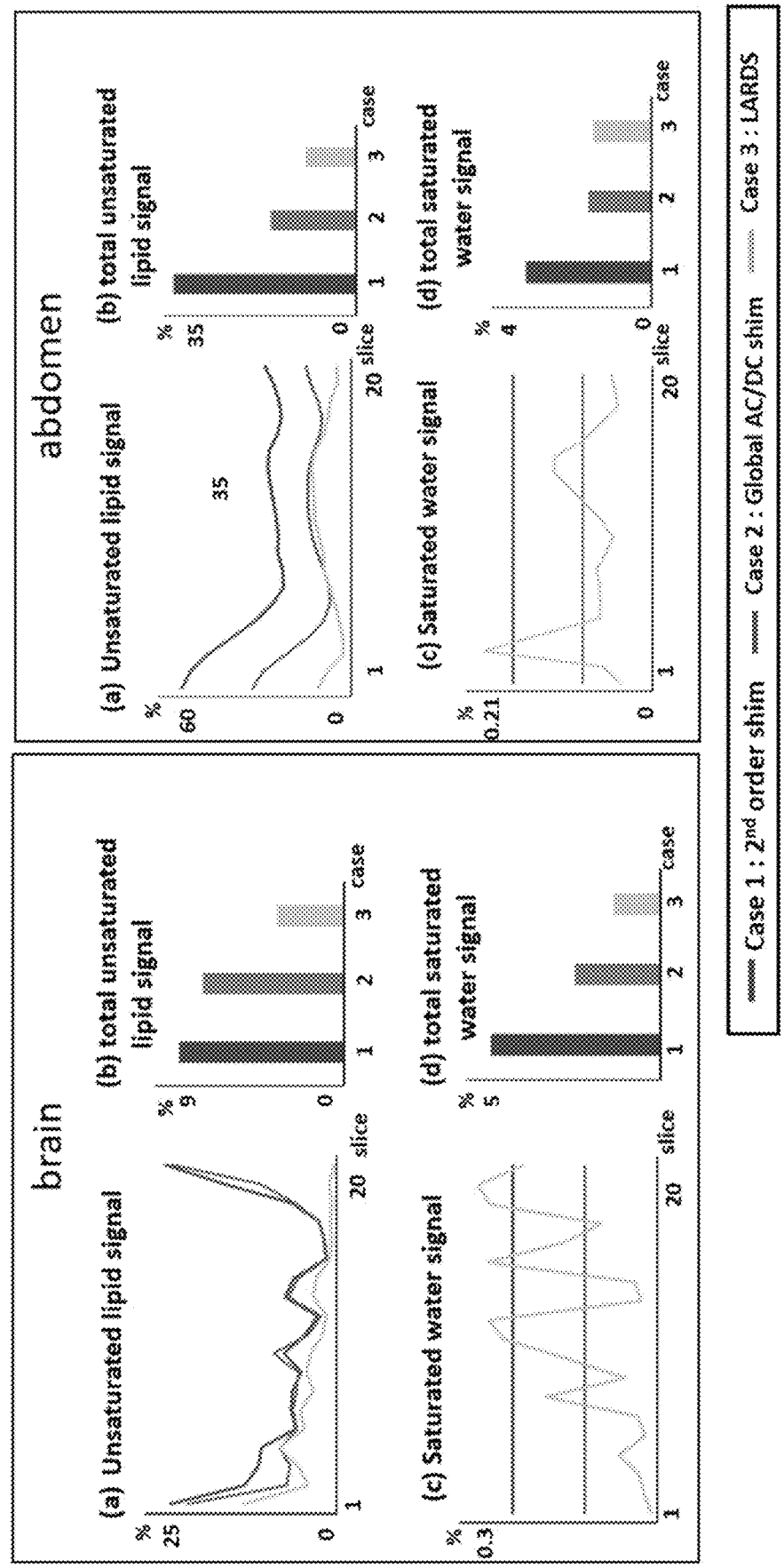
FIG. 7 illustrates simulated lipid suppression over all slices for 2D brain and abdomen imaging. Brain: (a) unsaturated lipid signal, (b) total unsaturated lipid signal, (c) saturated water signal and (d) total saturated water signal. Abdomen: (e) unsaturated lipid signal, (f) total unsaturated lipid signal, (g) saturated water signal and (h) total saturated water signal. In both brain and body simulations, the techniques described in the present disclosure reduce residual lipid levels while preserving the water signal.

FIGS. 5 and 6 show simulation results for multi-slice 2D imaging of the brain and body, respectively. The water and lipid frequency histograms and z-magnetization plots show that Case 2 (MC global shimming) does not significantly outperform Case 1 (baseline 2nd-order global shimming) for brain imaging, and provides only modest improvements for body imaging. By contrast, Case 3 (using the techniques described in the present disclosure, which may be referred to as Lipid Artifact Removal by Dynamic Shimming ("LARDS")) substantially improves water-lipid spectral separation, resulting in less residual lipid signal while also minimizing unwanted water saturation. The histograms in column (c) in FIGS. 5 and 6 show that the lipid pulse center frequency and stop band are shifted in order to optimally suppress lipids while minimizing water saturation. FIG. 7 summarizes performance on a slice-wise basis as well as over the whole imaging volume. For brain and body imaging, LARDS reduces residual lipid signal by over 50% while also modestly reducing unwanted water signal loss.

Simulations suggest that the benefits of LARDS are greater for 2D abdominal imaging relative to brain imaging, since the baseline Case 1 histograms show more water-lipid overlap for abdominal slices compared the brain slices, which arises from the far greater difficulty of global homogeneity shimming in the abdomen and its anatomical variability and complexity.

Figure 8:
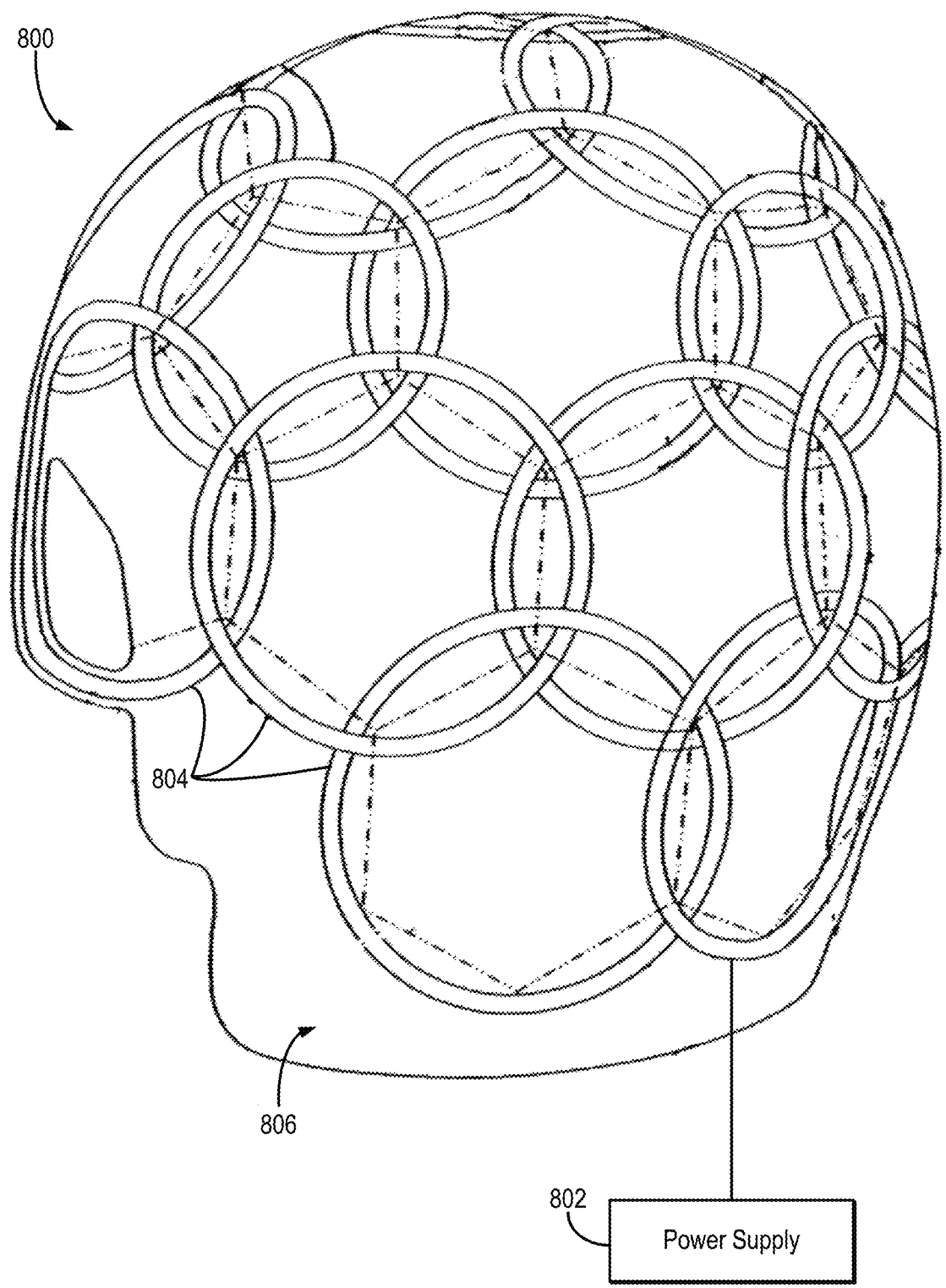
FIG. 8 is an example schematic of a local shim coil array formed as a head coil that may be implemented in some aspects described in the present disclosure.

Referring to FIG. 8, an example local shim coil array 800 is illustrated. The local shim coil array 800 may be coupled to a suitable power supply 802 chosen to supply up to, for example, 5 amps to each coil 804 in the local shim coil array 800. The power supply 802 is preferably designed to resist back-electromotive force ("EMF") voltages induced in the loop coils 804 of the array 800 during encoding gradient switching. For example, for an 10 cm loop lying 20 cm off isocenter and aligned in the X-Y plane, a gradient ramping through 40 mT/m in 100 microseconds may induce back-EMF of −0.5 Volts.

The local shim coil array 800 may be mounted on a helmet or other housing or substrate 806 and provide mechanical restraints to prevent motion of the coils 804 due to torques during gradient switching in the MRI scanner. Such restraints can be incorporated directly into the substrate 806. Regardless of the particular design, the mechanical restraints can be used to attach each coil 804 to the substrate 806 to ensure that coils 804 do not move due to torques that are produced on current carrying conductors when placed in the $B_0$ field.

In some examples, the coils 804 produce $B_0$ components in the X and Y planes, similar to the concomitant fields produced by physically-realizable gradient coils. However, since these components are small compared to the Z-component of the $B_0$ and gradient fields, they do not substantially affect image quality.

As illustrated in FIG. 8, arranging the coils 804 on a substrate 806 that tracks the contour of the head is advantageous. Specifically, close proximity of the shim coils 804 to the head is advantageous. Each additional centimeter of air gap between the coils 804 and the brain can degrade shim performance appreciably. In some examples, the RF coils may be integrated with the shimming coils 804 into the same physical space and using a substrate 806 that contours the head, shim performance can be provided with simultaneous sensitivity. That is, by designing a system that integrates RF and shimming coils to share the same conductor, the shimming coils 804 are as close as possible to the head without adversely impacting the performance of the RF coils. An example of such a combined RF and local shim coil array is described in U.S. Pat. No. 10,261,145, which is herein incorporated by reference in its entirety.

Figure 9:
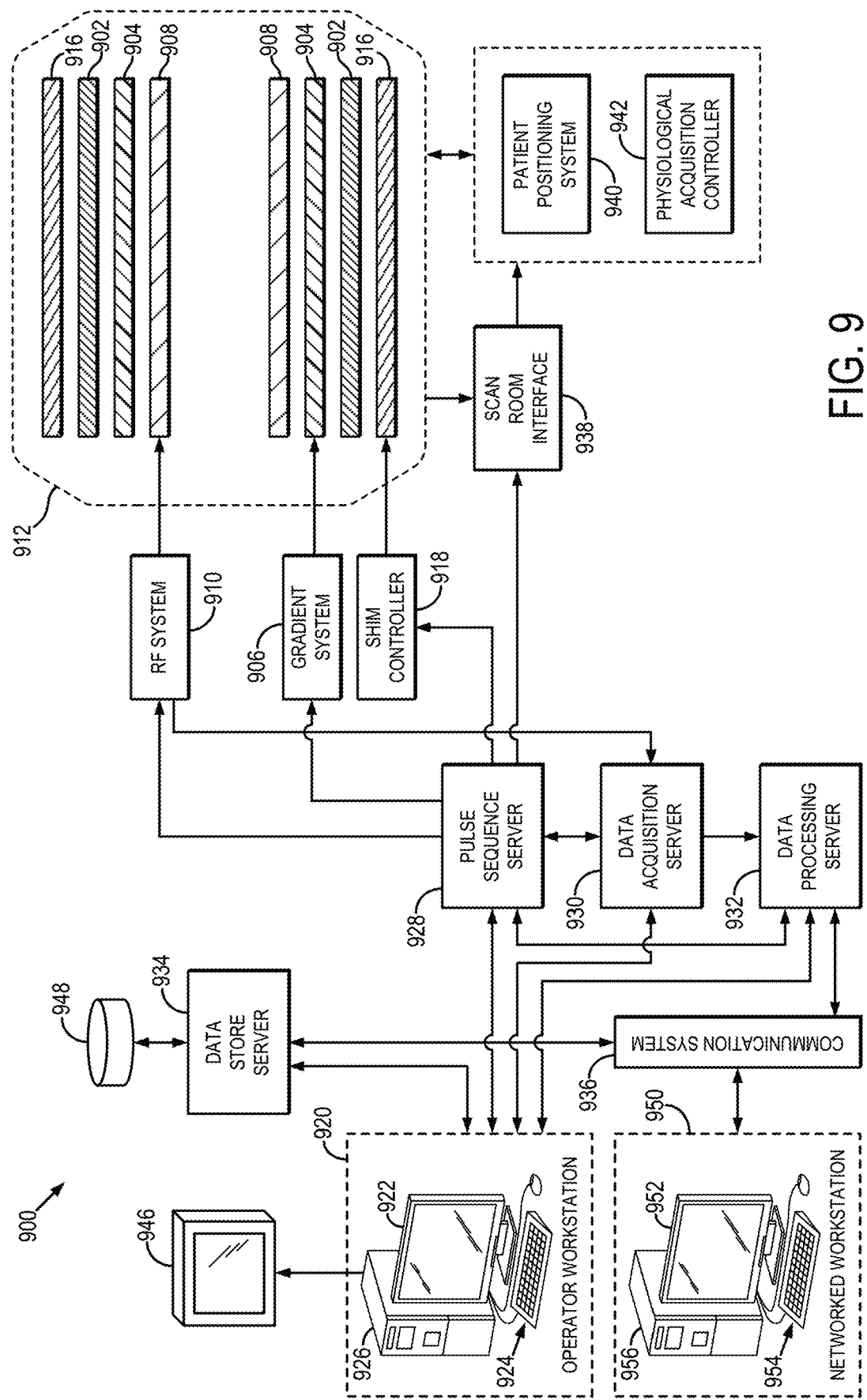
FIG. 9 is a block diagram of an example MRI system that may implement the systems and methods described in the present disclosure.

Referring particularly now to FIG. 9, an example of an MRI system 900 that can implement the methods described here is illustrated. The MRI system 900 includes a magnet assembly 902 that generates a main magnetic field, $B_0$, which may also be referred to as a polarizing magnetic field. The MRI system 900 also includes a gradient coil assembly 904 containing one or more gradient coils, which is controlled by a gradient system 906, and a radiofrequency ("RF") coil assembly 908 containing one or more RF coils, which is controlled by an RF system 910.

The RF coil assembly 908 can include one or more RF coils that are enclosed within a housing 912 of the MRI system 900, or can include one or more RF coils that are physically separate from the housing 912, such as local RF coils that can be interchangeably positioned within the bore of the MRI system 900. Similarly, the gradient coil assembly 904 can include one more gradient coils that are enclosed within the housing 912 of the MRI system 900, or can include one or more gradient coils that are physically separate from the housing 912 and that can be interchangeably positioned within the bore of the MRI system 900. The housing 912 may be sized to receive a subject's body, or sized to receive only a portion thereof, such as a subject's head.

The magnet assembly 902 generally includes a superconducting magnet that is formed as one or more magnet coils made with superconducting wire, high temperature superconducting ("HTS") wire, or the like. The one or more magnet coils can be arranged as a solenoid, a single-sided magnet, a dipole array, or other suitable configuration. The superconducting magnet can be cooled using a liquid or gaseous cryogen.

As will be described, the RF coil assembly 908 generates one or more RF pulses that rotate magnetization of one or more resonant species in a subject or object positioned in the main magnetic field, $B_0$, generated by the magnet assembly 902. In response to the one or more transmitted RF pulses, magnetic resonance signals are generated, which are detected to form an image of the subject or object. The gradient coil assembly 904 generates magnetic field gradients for spatially encoding the magnetic resonance signals. Collectively, the one or more RF pulses and the one or more magnetic field gradients define a magnetic resonance pulse sequence.

In some configurations, the MRI system 900 can also include a shim coil assembly 916. The shim coil assembly 916 can include passive shims, active shims, or combinations thereof. The shim coil assembly 916 may include an array of body shim coils, as illustrated. Additionally or alternatively, a local shim coil array, such as local shim coil array 800 described above, may be used. Active shims can include active shim coils that generate magnetic fields in order to shim, or reduce inhomogeneities, in the main magnetic field, $B_0$, generated by the magnet assembly 902. In some configurations, the active shim coils in the shim coil assembly 916 and/or local shim coil array 800 are controlled by an active shim controller 918. As a non-limiting example, the active shim controller 918 can implement the methods described in the present disclosure to $B_0$ offset fields to facilitate lipid suppression as described above.

The MRI system 900 includes an operator workstation 920 that may include a display 922, one or more input devices 924 (e.g., a keyboard, a mouse), and a processor 926. The processor 926 may include a commercially available programmable machine running a commercially available operating system. The operator workstation 920 provides an operator interface that facilitates entering scan parameters into the MRI system 900. The operator workstation 920 may be coupled to different servers, including, for example, a pulse sequence server 928, a data acquisition server 930, a data processing server 932, and a data store server 934. The operator workstation 920, the pulse sequence server 928, the data acquisition server 930, the data processing server 932, and the data store server 934 may be connected via a communication system 936, which may include wired or wireless network connections.

The pulse sequence server 928 functions in response to instructions provided by the operator workstation 920 to operate the gradient system 906 and the RF system 910. Gradient waveforms for performing a prescribed scan are produced and applied to the gradient system 906, which then excites gradient coils in the gradient coil assembly 904 to produce the magnetic field gradients (e.g., $G_x$, $G_y$, and $G_z$ gradients) that are used for spatially encoding magnetic resonance signals.

RF waveforms are applied by the RF system 910 to the RF coil assembly 908 to generate one or more RF pulses in accordance with a prescribed magnetic resonance pulse sequence. Magnetic resonance signals that are generated in response to the one or more transmitted RF pulses are detected by the RF coil assembly 908 and received by the RF system 910. The detected magnetic resonance signals may be amplified, demodulated, filtered, and digitized under direction of commands produced by the pulse sequence server 928.

The RF system 910 includes an RF transmitter for producing a wide variety of RF pulses used in magnetic resonance pulse sequences. The RF transmitter may include a single transmit channel, or may include multiple transmit channels each controlling a different RF transmit coil. The RF transmitter is responsive to the prescribed scan and direction from the pulse sequence server 928 to produce RF pulses of the desired frequency, phase, and pulse amplitude waveform. The generated RF pulses may be applied to the RF coil assembly 908, which as described above may include one or more RF coils enclosed in the housing 912 of the MRI system 900 (e.g., a body coil), or one or more RF coils that are physically separate from the housing 912 (e.g., local coils or coil arrays).

The RF system 910 also includes one or more RF receiver channels. An RF receiver channel includes an RF preamplifier that amplifies the magnetic resonance signal received by the RF coil in the RF coil assembly 908 to which the receiver channel is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2};$$

and the phase of the received magnetic resonance signal may also be determined according to the following relationship:

$$\varphi = \tan^{-1}\left(\frac{Q}{I}\right).$$

When the MRI system 900 includes a shim assembly 916 having one or more active shim coils, the pulse sequence server 928 can also connect to an active shim controller 918 to apply shim coil waveforms for generating magnetic fields to shim the main magnetic field, $B_0$, generated by the magnet assembly 902 and/or to $B_0$ offset fields to facilitate lipid suppression by moving the lipid and water resonance peaks apart from each other. In such instances, the pulse sequence server 928 can provide waveforms to the active shim controller 918 in order to generate such magnetic fields in accordance with a magnetic resonance pulse sequence, such as the pulse sequence described above with respect to FIG. 3.

The pulse sequence server 928 may also connect to a scan room interface 938 that can receive signals from various sensors associated with the condition of the subject or object being imaged, the magnet assembly 902, the gradient coil assembly 904, the RF coil assembly 908, the shim assembly 916, or combinations thereof. In one example, the scan room interface 938 can include one or more electrical circuits for interfacing the pulse sequence server 928 with such sensors. Through the scan room interface 938, a patient positioning system 940 can receive commands to move the subject or object being imaged to desired positions during the scan, such as by controlling the position of a patient table.

The pulse sequence server 928 may also receive physiological data from a physiological acquisition controller 942 via the scan room interface 938. By way of example, the physiological acquisition controller 942 may receive signals from a number of different sensors connected to the subject, including electrocardiograph ("ECG") signals from electrodes, respiratory signals from a respiratory bellows or other respiratory monitoring devices, and so on. These signals may be used by the pulse sequence server 928 to synchronize, or "gate," the performance of the scan with the subject's heart beat or respiration.

Digitized magnetic resonance signal samples produced by the RF system 910 are received by the data acquisition server 930 as magnetic resonance data, which may include k-space data. In some scans, the data acquisition server 930 passes the acquired magnetic resonance data to the data processing server 932. In scans that implement information derived from the acquired magnetic resonance data to control further performance of the scan, the data acquisition server 930 may be programmed to produce such information and to convey it to the pulse sequence server 928. For example, during pre-scans, magnetic resonance data may be acquired and used to calibrate the pulse sequence performed by the pulse sequence server 928. As another example, navigator signals may be acquired and used to adjust the operating parameters of the RF system 910 or the gradient system 906, or to control the view order in which k-space is sampled.

The data processing server 932 receives magnetic resonance data from the data acquisition server 930 and processes the magnetic resonance data in accordance with instructions provided by the operator workstation 920. Such processing may include, for example, reconstructing two-dimensional or three-dimensional images by performing a Fourier transformation of raw k-space data, performing other image reconstruction algorithms (e.g., iterative reconstruction algorithms), applying filters to raw k-space data or to reconstructed images, and so on.

Images reconstructed by the data processing server 932 can be conveyed back to the operator workstation 920 for storage. Real-time images may be stored in a database memory cache, from which they may be output to operator display 922 or to a separate display 946. Batch mode images or selected real-time images may also be stored in a data storage 948, which may be a host database containing a disc storage. When such images have been reconstructed and transferred to storage, the data processing server 932 may notify the data store server 934 on the operator workstation 920. The operator workstation 920 may be used by an operator to archive the images or send the images via a network to other facilities.

The MRI system 900 may also include one or more networked workstations 950. For example, a networked workstation 950 may include a display 952, one or more input devices 954 (e.g., a keyboard, a mouse), and a processor 956. The networked workstation 950 may be located within the same facility as the operator workstation 920, or in a different facility, such as a different healthcare institution or clinic.

The networked workstation 950 may gain remote access to the data processing server 932 or data store server 934 via the communication system 936. Accordingly, multiple networked workstations 950 may have access to the data processing server 932 and the data store server 934. In this manner, magnetic resonance data, reconstructed images, or other data may be exchanged between the data processing server 932 or the data store server 934 and the networked workstations 950, such that the data or images may be remotely processed by a networked workstation 950.

The present disclosure has described one or more preferred embodiments, and it should be appreciated that many equivalents, alternatives, variations, and modifications, aside from those expressly stated, are possible and within the scope of the invention.

The invention claimed is:
1. A method for lipid suppression in magnetic resonance imaging (MRI), the method comprising:
   (a) acquiring k-space data with an MRI system using a pulse sequence comprising a lipid suppression block for suppressing lipid signals and an imaging block for acquiring the k-space data, wherein the lipid suppression block comprises for each slice in a planned slice prescription:
applying a lipid suppression radio frequency (RF) pulse having a center frequency and a bandwidth tailored for the slice; and
generating a $B_0$ offset field with a shim coil array while applying the lipid suppression RF pulse, the $B_0$ offset field being tailored for the slice; and
(b) reconstructing a plurality of images from the k-space data using a computer system, the plurality of images comprising an image for each slice in the planned slice prescription in which lipid signals are substantially suppressed.

2. A method for lipid suppression in magnetic resonance imaging (MRI), the method comprising:
(a) accessing $B_0$ field map data with a computer system;
(b) generating local mask data for each slice in a planned slice prescription using the computer system, wherein the local mask data comprise a lipid mask for each slice in the planned slice prescription;
(c) inputting the $B_0$ field map data and local mask data to a joint optimization algorithm using the computer system, generating shim current settings and lipid suppression pulse parameters as an output;
(d) designing a pulse sequence using the computer system, wherein the pulse sequence comprises a lipid suppression block designed based on the shim current settings and lipid suppression pulse parameters;
(e) acquiring k-space data from slices in a subject according to the planned slice prescription using an MRI system performing the pulse sequence, wherein the lipid suppression block of the pulse sequence comprises, for each slice in the planned slice prescription:
applying a spectrally selective radio frequency (RF) pulse using the lipid suppression pulse parameters for the respective slice;
generating a $B_0$ offset field by supplying the shim current settings for the respective slice to a shim coil array; and
(f) reconstructing a plurality of images from the k-space data, wherein the plurality of images depict the slices in the subject with reduced lipid signals.

3. A magnetic resonance imaging system, comprising:
a magnet system to generating a main magnetic field, $B_0$;
a radio frequency (RF) system comprising at least one RF coil;
a gradient system comprising at least one gradient coil;
a shim system comprising a shim coil array;
a processor to:
receive slice-specific lipid suppression RF pulse parameters;
receive slice-specific shim current settings;
for a given slice in a planned slice prescription, simultaneously control:
the at least one RF coil of the RF system to generate a spectrally selective RF pulse according to the slice-specific lipid suppression RF pulse parameters for the given slice; and
the shim coil array of the shim system to generate a $B_0$ offset field according to the slice-specific shim current settings for the given slice.

4. The method of claim 1, wherein each $B_0$ offset field is generated by supplying a shim current to the shim coil array, wherein the shim current is tailored for the respective slice.

5. The method of claim 1, wherein the imaging block comprises an echo planar imaging pulse sequence.

6. The method of claim 1, wherein the shim coil array comprises a local shim coil array.

7. The method of claim 1, wherein the lipid suppression block comprises applying at least one spoiler gradient after the lipid suppression RF pulse to dephase lipid magnetization tipped into a transverse plane by the lipid suppression RF pulse.

8. The method of claim 2, wherein the shim current settings and lipid suppression pulse parameters are jointly optimized with the computer system using a joint optimization algorithm.

9. The method of claim 2, wherein the lipid suppression pulse parameters comprise a center frequency and a bandwidth.

10. The method of claim 2, wherein the pulse sequence comprises an echo planar imaging pulse sequence.

11. The method of claim 2, wherein the lipid suppression block comprises applying at least one spoiler gradient after the spectrally selective RF pulse to dephase lipid magnetization tipped into a transverse plane by the spectrally selective RF pulse.

12. The MRI system of claim 3, wherein the shim coil array comprises a local shim coil array.

13. The method of claim 4, wherein the shim current, center frequency, and bandwidth for each slice are jointly optimized with the computer system using a joint optimization algorithm.

14. The method of claim 6, wherein the local shim coil array comprises a plurality of coil that are switchable between RF receive coils and shim coils.

15. The method of claim 8, wherein the joint optimization algorithm takes as inputs a $B_0$ field map and local lipid mask data indicating a lipid mask for each slice in the planned slice prescription.

16. The MRI system of claim 12, wherein the at least one RF coil is integrated with the local shim coil array.

17. The method of claim 13, wherein the joint optimization algorithm takes as inputs a $B_0$ field map and local lipid mask data indicating a lipid mask for each slice in the planned slice prescription.

18. The method of claim 15, wherein the local mask data are generated with the computer system by simulating a slice-select process for each slice in the planned slice prescription to create the lipid mask for each slice.

19. The MRI system of claim 16, wherein the shim coil array comprises coil elements that are switchable between an RF receiver for the at least one RF coil and a shim coil for the local shim coil array.

20. The method of claim 17, wherein the local mask data are generated with the computer system by simulating a slice-select process for each slice in the planned slice prescription to create the lipid mask for each slice.

* * * * *